United States Patent [19]

Aoyama

[11] Patent Number: 5,097,113

[45] Date of Patent: Mar. 17, 1992

[54] TOUCH SWITCH ARRANGEMENT FOR A HEATING COOKING APPLIANCE

[75] Inventor: Michishige Aoyama, Ohita, Japan

[73] Assignee: Kabushiki Kaisha Toshiba, Japan

[21] Appl. No.: 511,330

[22] Filed: Apr. 19, 1990

[30] Foreign Application Priority Data

Apr. 27, 1989 [JP] Japan .................. 1-111239

[51] Int. Cl.$^5$ .............................................. H05B 1/02
[52] U.S. Cl. ................................. 219/448; 219/492; 219/506; 341/24
[58] Field of Search ............. 219/494, 445, 497, 501, 219/505, 506, 492, 412, 413, 10.55 B; 341/24-26

[56] References Cited

U.S. PATENT DOCUMENTS

| | | | | |
|---|---|---|---|---|
| 4,410,795 | 10/1983 | Ueda | ..................... | 219/506 |
| 4,418,262 | 11/1983 | Noda | ..................... | 219/506 |
| 4,633,067 | 12/1986 | Payne et al. | ..................... | 219/506 |
| 4,920,253 | 4/1990 | Takei | ..................... | 341/24 |

FOREIGN PATENT DOCUMENTS

| | | | |
|---|---|---|---|
| 0117623 | 7/1984 | Japan | ..................... 341/24 |
| 0201422 | 10/1985 | Japan | ..................... 341/24 |
| WO86/01355 | 2/1986 | PCT Int'l Appl. | |
| 2034043 | 5/1980 | United Kingdom . | |
| 2040091 | 8/1980 | United Kingdom . | |
| 2105930 | 3/1983 | United Kingdom . | |
| 2163308 | 2/1986 | United Kingdom . | |
| 84/02594 | 7/1984 | World Int. Prop. O. | ..................... 341/24 |

*Primary Examiner*—Mark H. Paschall
*Attorney, Agent, or Firm*—Limbach & Limbach

[57] ABSTRACT

A heating cooking appliance includes a heater for the cooking, a switch generating an operation signal while being touched or depressed with a finger or the like, and a microcomputer for controlling the heater so that energization of the heater is initiated in the case where the operation signal generated by the switch is continuously input into the microcomputer for a predetermined period of time. The heater is not energized only when the switch is touched by accident or mistake. When a user depresses the switch for the predetermined period of time with the intention of initiating the cooking, the heater is energized.

3 Claims, 3 Drawing Sheets ers even when the user happens to touch the switch by mistake, the operation signal is generated by the same and accordingly, the microcomputer operates to initiate the energization of the heater. Thus, the conventional heating cooking appliance does not provide for sufficient safety.

TOUCH SWITCH ARRANGEMENT FOR A HEATING COOKING APPLIANCE

BACKGROUND OF THE INVENTION

The invention relates to heating cooking appliances provided with a switch generating an operation signal while the switch is being touched or depressed with a finger or the like and heating means for the cooking controlled by way of operation of the switch.

Conventionally, such heating cooking appliance of the type as described above has been equipped with a microcomputer as means for controlling energization of the heating means. When the switch is operated, the operation signal is generated by the same and input into the microcomputer. Simultaneously, the energization of the heating means such as sheathed heater is initiated.

In the above-described heating cooking appliance, however, even when the user happens to touch the switch by mistake, the operation signal is generated by the same and accordingly, the microcomputer operates to initiate the energization of the heater. Thus, the conventional heating cooking appliance does not provide for sufficient safety.

SUMMARY OF THE INVENTION

It is, therefore, an object of the present invention to provide a heating cooking appliance wherein the energization of the heating means is not initiated when the switch is merely touched slightly with the finger by mistake, thereby improving the safety of the appliance.

The present invention provides a heating cooking appliance comprising heating means for cooking, a switch generating an operation signal while being touched or depressed with a finger or the like, and control means for controlling the heating means so that energization of the heating means is initiated in the case where the operation signal generated by the switch is continuously input into the control means for a predetermined period of time.

The duration of the operation signal generated by the switch is relatively short when the user slightly touches the switch by mistake. Accordingly, when the above-described control means is arranged so that the energization of the heating means is initiated when the operation signal is continuously generated for the period longer than that in the case where the user slightly touches the switch by mistake, the heating means is not energized when the switch is slightly touched by mistake and the energization of the heating means is initiated only when the user depresses the switch for a relatively long period with the intention of starting the cooking.

It is preferable that the heating means comprise a halogen lamp. Since the halogen lamp is lighted immediately after initiation of energization of thereof, the user may visually confirm the initiation of energization of the halogen lamp. Furthermore, it is preferable that the heating means comprise a sheathed heater or an induction heating coil.

It is preferable that the above-mentioned predetermined period of time range from 0.3 to 2 seconds. In this regard, when the predetermined period is set to the value above 0.3 seconds, a definite difference may be established between the period for which the switch is touched by mistake and that for which the user continuously depresses the switch with the intention of starting the cooking. Consequently, determination of the misoperation may be made with ease. When the predetermined period is set to the value below 2 seconds, the user may not have an impression that the period that the switch is continuously depressed is long, whereby the usability of the appliance may not be lowered. Additionally, the user unfamiliar with the operation of the appliance does not have an uneasiness that something is wrong with the appliance.

Furthermore, it is preferable that the above-mentioned predetermined period be set to 0.7 seconds. In this regard, the determination of the misoperation may be made for certain and the user is not given an impression that the switch has to be depressed long, thus improving the usability of the appliance.

Furthermore, it is preferable that the control means comprise a microcomputer.

Since the energization of the heating means is not initiated unless the switch is continuously operated for a relatively long period as described above, the heating means is not energized immediately after operation of the switch. Accordingly, the user cannot determine whether or not the operation is effective and therefore, may feel uneasy about the operation of the appliance. To cope with the problem, it is preferable that alarm means be provided to be activated while the operation signal is being continuously generated and deactivated when the energization of the heating means is initiated. In this regard, since the user may confirm that the switch operation is effective, when the alarm means is being driven, the user may feel easy.

It is preferable that the alarm means comprise a buzzer. In this case, as the buzzer is activated, the user may auditorily confirm that the switch operation is effective.

Furthermore, preferably, a buzzer is provided so as to be activated when the energization of the heating means is initiated. The user may auditorily confirm the initiation of energization of the heating means. In particular, when the heating means comprises a sheathed heater or induction heating coil, each of them gives no indication visually confirmed immediately after initiation of energization thereof. Consequently, provision of the buzzer is effective.

The present invention may also be practiced by a heating cooking appliance comprising heating means for cooking, a switch generating an operation signal while being touched or depressed with a finger or the like, timer means for counting a duration of the operation signal continuously input thereto from the switch, and energization control means for controlling the heating means so that the energization of the heating means is initiated when the value counted by the timer means reaches a predetermined value.

It is preferable that the energization control means and timer means comprise a one-chip microcomputer. As a result, the electrical arrangement of the appliance may be simplified.

Other objects of the present invention will become obvious upon an understanding of the illustrative embodiments about to be described or will be indicated in the appended claims, and various advantages not referred to herein will occur to one skilled in the art upon employment of the invention in practice.

DESCRIPTION OF THE PREFERRED EMBODIMENTS

A first embodiment of the invention will now be described with reference to FIGS. 1 to 5 of the drawings.

Figure 2:
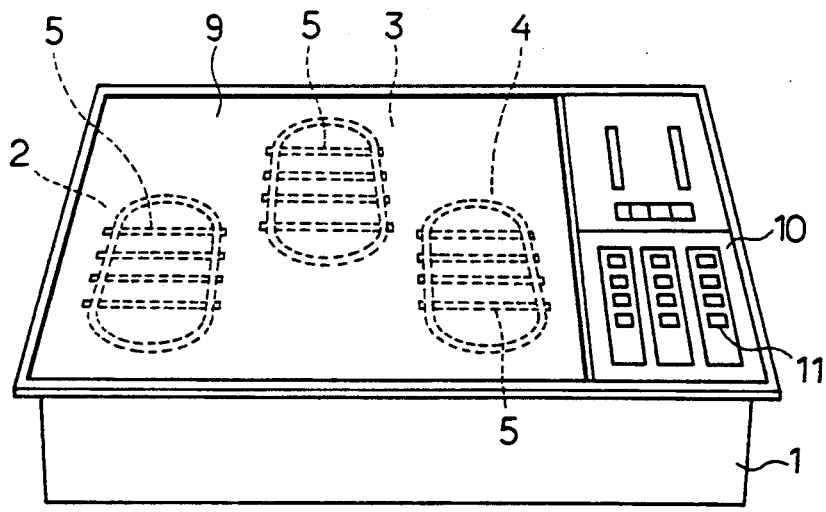
FIG. 2 is a perspective view of the heating cooking appliance.
Figure 3:
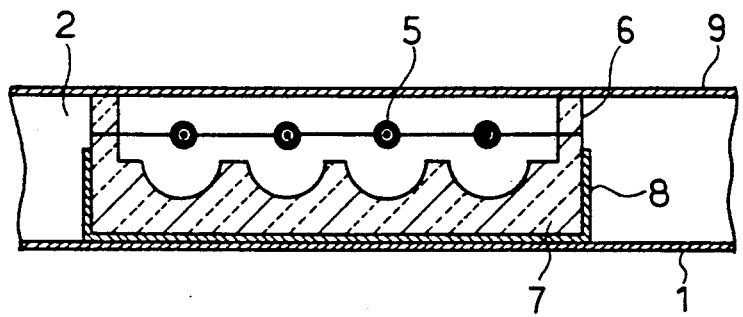
FIG. 3 is a longitudinal sectional view of the major part of the heating cooking appliance.
Figure 4:
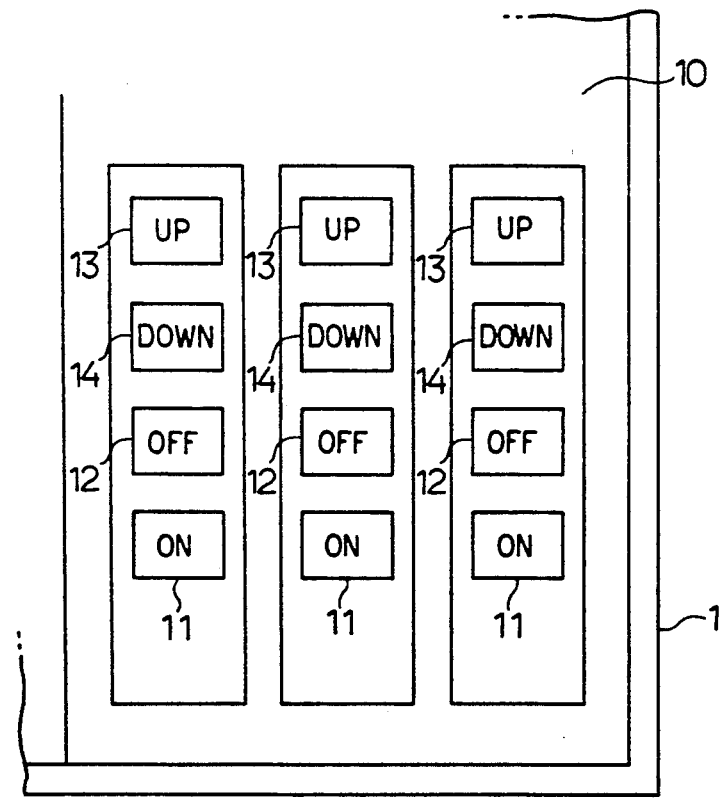
FIG. 4 is a plan view of an operation panel of the heating cooking appliance.

Referring first to FIG. 2, an outer frame 1 of the heating cooking appliance is formed into a generally flat rectangular box shape. Three heating units 2, 3 and 4, for example, are provided in the outer frame 1. Each of the heating units comprises four halogen lamps 5, for example, as heating means disposed between upper and lower elliptic heat insulators 6 and 7, as shown in FIG. 3. The bottomed lower heat insulator 7 is received by a receptacle 8 secured to the inner bottom of the outer frame 1. Upper surfaces of the heating units 2-4 are covered by a top plate 9 formed from heat-proof glass. An operation panel 10 is provided on the outer frame 2 so as to be planar to the top plate 9. As shown in FIG. 4, ON and OFF switches 11 and 12 for initiating and terminating the heating operation, INPUT-UP and INPUT-DOWN switches 13 and 14 for adjusting the calorific value (or input power) of each halogen lamp 5 are provided on the operation panel 10. Three sets of these switches 11 to 14 are provided for three heating units 2 to 4, respectively. Each of the switches 11 to 14 is arranged to output an ON signal as an operation signal, for example, while being touched or depressed with a finger or the like. Such a touch switch may be of the capacitive touch type, infrared ray beam type, resistive film type or acoustic type or may be a push switch with a short stroke. Three light emitting diodes (not shown) are provided on the operation panel 10 for indicating the magnitude of the input to each halogen lamp 5. When INPUT-UP and INPUT-DOWN switches 13 and 14 are operated for the purpose of adjusting the calorific value of each halogen lamp 5, the magnitude of the input adjusted is indicated by the light emitting diode.

Figure 5:
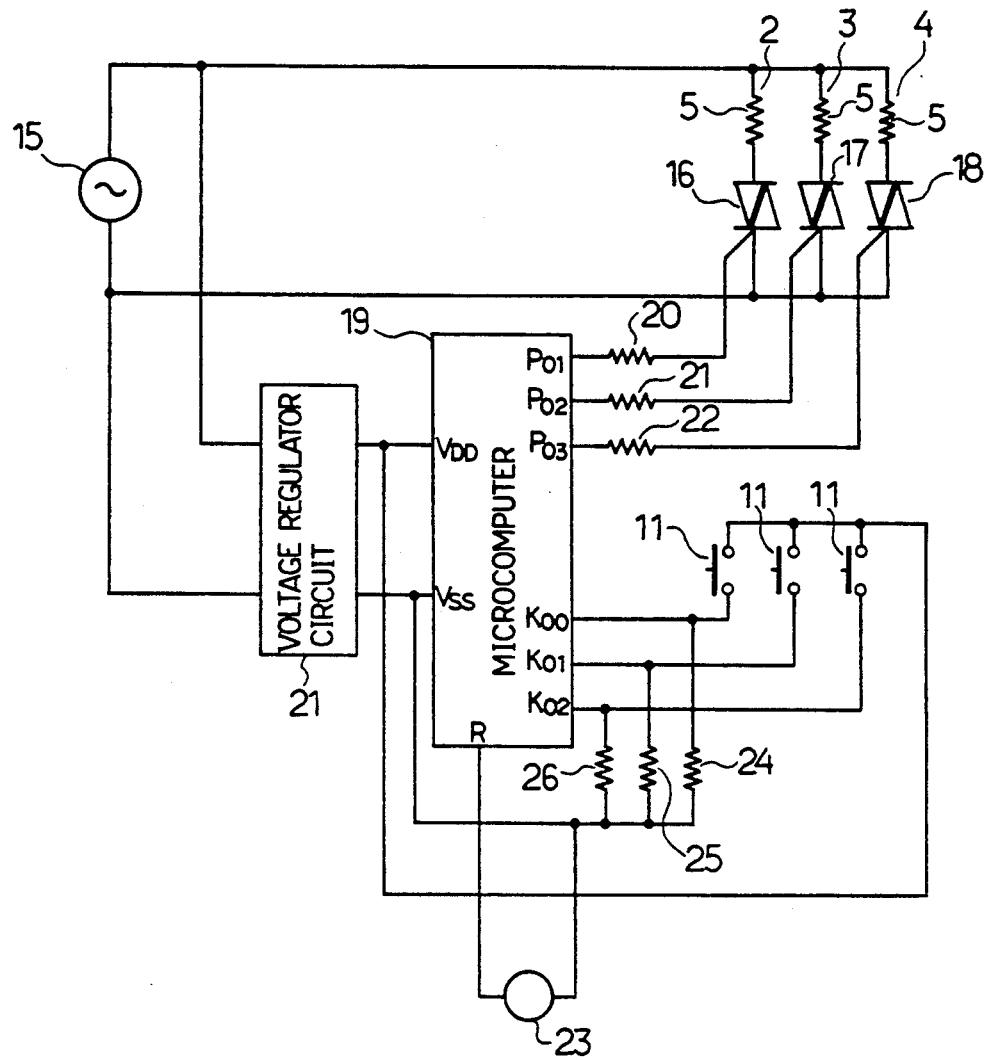
FIG. 5 illustrates an electrical arrangement of the heating cooking appliance.

Referring now to FIG. 5 showing an electrical arrangement of the heating cooking appliance, each set of four halogen lamps 5 of the respective heating units 2-4 are connected in parallel to an AC power supply 15. Bidirectional triode thyristers or triacs 16 to 18 are connected in series to the three sets of the halogen lamps 5, respectively. Each halogen lamp 5 is controlled by a one-chip microcomputer 19 as control means. The microcomputer 19 further controls the operation of the heating cooking appliance in accordance with an internally stored control program. The ON switches 11 are connected to input ports K00, K01 and K02 of the microcomputer 19, respectively. Gates of the triacs 16-18 are connected to output ports P01, P02 and P03 of the microcomputer 19 through resistances 20-22, respectively. Furthermore, a buzzer 23 as alarm means is connected to an output port R of the microcomputer 19.

The microcomputer 19 controls the phases of voltages applied to the halogen lamps 5 through the triacs 16-18, thereby adjusting the calorific value of each halogen lamp 5. A DC constant voltage is applied to the microcomputer 19, ON switch 11 and the like from a voltage-regulator circuit 21. Reference numerals 24 to 26 designate pull-down resistors. The OFF switch 12, INPUT-UP switch 13 and INPUT-DOWN switch 14 are eliminated in FIG. 5.

Figure 1:
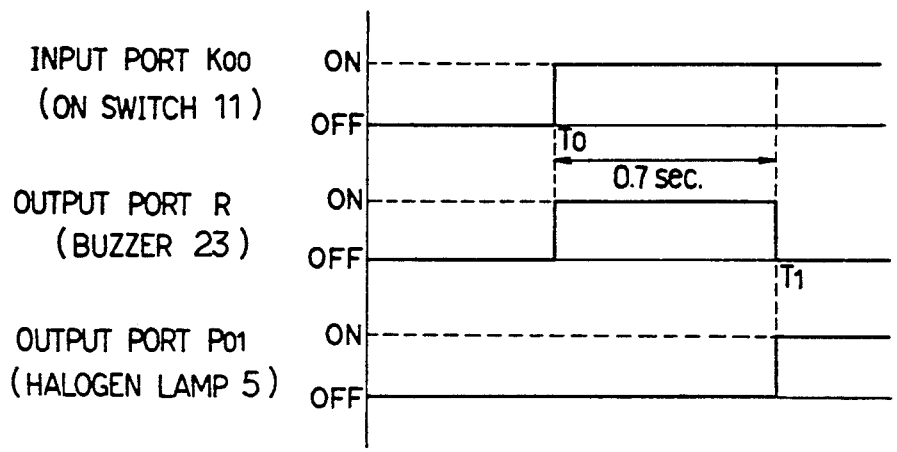
FIG. 1 is a time chart showing the operation of a heating cooking appliance of a first embodiment.

The operation of the heating cooking appliance thus arranged will now be described FIGS. 1 to 5. Since the heating units 2 to 4 are operated in the same manner, the description will be directed only to the heating unit 2. As shown in FIG. 1, when the ON switch 11 is depressed with a finger at time T0, the ON signal is generated by the ON switch 11, which signal is supplied to the input port K00 of the microcomputer 19. In response to the ON signal, the microcomputer 19 operates the built-in timer means to start the time counting. The microcomputer 19 also delivers a buzzer drive signal from the output port R to the buzzer 23, thereby activating the same. The ON switch 11 remains depressed in this while and accordingly, the ON signal is continuously generated. The microcomputer 19 continuously delivers the buzzer drive signal from the output port R to the buzzer 23 to thereby continuously drive the same while the ON signal is being generated. Subsequently, in the case where the ON signal is continuously generated for a predetermined period, for example, 0.7 seconds from time T0 to time T1, the time counting operation of the timer means is terminated at time T1 and a high level drive signal is delivered from the output port P01 to the gate of the triac 16, thereby initiating the energization of the halogen lamps 5. Simultaneously, the delivery of the buzzer drive signal to the buzzer 23 is terminated, thereby deactivating the same. On the other hand, in the case where the ON signal is not continuously delivered from the ON switch 11 for 0.7 seconds, the supply of the buzzer drive signal to the buzzer 23 is terminated to thereby deactivate the same when generation of the ON signal is terminated or when the ON switch 11 depressed is released. In this case, energization of the halogen lamps 5 is not initiated.

In accordance with the above-described embodiment, the ON signal delivered from the ON switch 11 is not continued for 0.7 seconds when the user happens to touch the ON switch 11 by mistake. Accordingly, energization of each halogen lamp 5 is not initiated and consequently, sufficient safety is ensured.

Although the predetermined period for which the ON switch is held depressed is set to the period of 0.7 seconds in the foregoing embodiment, the period should not be limited to 0.7 seconds. To determine the period, two points are taken into account. First, the period should be long enough to determine the misoperation. Second, the period should not give the user an impression that the period is too long. A desirable predetermined period ranges between 0.3 and 2 seconds. When the period is set to the value below 0.3 seconds, there is little difference between the predetermined period and the period during which the ON switch 11 is touched by mistake, which makes it difficult to determine the misoperation. Furthermore, when the predetermined period exceeds the period of 2 seconds, the period gives the user an impression that the period during which the ON switch is held depressed is too long, thereby reducing the usability of the heating cooking appliance. Additionally, such a long period causes the user unfamiliar with the operation of the appliance an uneasiness that something is wrong with the appliance. The period of 0.7 seconds is the most desirable in the above-noted range.

Conventionally, for the purpose of preventing the chattering of a switch, it is determined that the switch has been turned on, in the case where the ON signal is generated for approximately 10 milliseconds. In this regard, the ON signal is determined to have such a short period of approximately 10 milliseconds and accordingly, it cannot be determined whether or not the user has touched the switch by mistake, based on such a short period. Consequently, this conventional arrangement has a problem that the heating means is mistakenly energized based on the misoperation of the switch. On the other hand, in the present invention, the heating means is not energized even when the user happens to touch the switch by mistake, thereby improving the safety of the heating cooking appliance.

Furthermore, the energization of the halogen lamps 5 is not initiated unless the ON switch 11 is touched or depressed with the finger for 0.7 seconds. In this regard, since the halogen lamps 5 are not energized while the ON switch 11 is being touched or depressed, there is a possibility that the user cannot determine whether or not the touching or depressing operation is effective, which would cause the user an uneasiness. In the above-described embodiment, however, the buzzer 23 is activated while the ON signal is continuously generated from the ON switch 11. As a result, when the buzzer 23 is being activated, it is determined that the operation is effective and thus, the user is not given an uneasiness. Additionally, the buzzer 23 is also activated even when the user happens to touch the ON switch 11 by mistake. Thus, activation of the buzzer 23 allows the user to notice that the ON switch 11 has been touched by mistake. Consequently, the ON switch 11 may be prevented from being kept touched or depressed for a long period.

The halogen lamps 5 are employed as the heating means in the foregoing embodiment. Energization of each halogen lamp 5 is initiated after depression of the ON switch 11 continues for 0.7 seconds and the buzzer 23 is deactivated. Each halogen lamp 5 is promptly lighted. Accordingly, when each halogen lamp 5 is lighted, the user may visually determine that each halogen lamp 5 has been energized.

Although the halogen lamps 5 have been employed as heating means in the foregoing embodiment, sheathed heaters or induction heating coils may be employed, instead.

Although the ON signal is generated as the operation signal by the ON switch 23 in the foregoing embodiment, an OFF signal may be generated by the switch. Further, any signal that can be recognized by the microcomputer may be employed.

Figure 6:
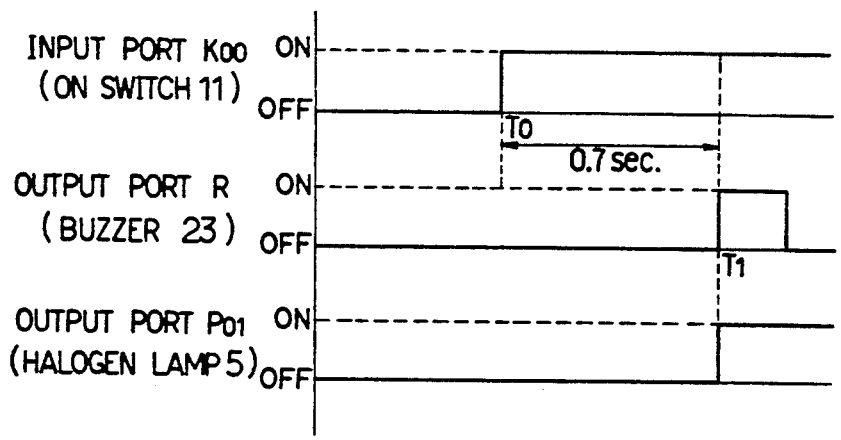
FIG. 6 is a view similar to FIG. 1 showing the heating cooking appliance of a second embodiment.

FIG. 6 illustrates a second embodiment of the invention. The buzzer 23 is not activated at time T0 when the ON switch 11 is touched with the finger or the like. In the case where the depression and accordingly, output of the ON signal from the ON switch 11 continues for 0.7 seconds from time T0 to time T1, the microcomputer 19 operates to deliver the high level drive signal from the output port P01 to the gate of the triac 16, thereby initiating the energization of the halogen lamps 5. Simultaneously, the microcomputer 19 operates to deliver the high level buzzer drive signal from the output port R to the buzzer 23, thereby activating the same. The buzzer 23 is activated for a predetermined period, for example, 0.5 seconds. This period of activation of the buzzer 23 is not limited to the period of 0.5 seconds. The period may be long enough for the user to acknowledge the initiation of energization of the halogen lamps 5.

Accordingly, the same effect may be achieved in the second embodiment as in the first embodiment. Additionally, since activation of the buzzer 23 is simultaneous with initiation of energization of the halogen lamps 5, the user can definitely perceive the initiation of energization of the halogen lamps 5 as the heating means. In particular, in the case where the sheathed heaters or induction heating coils are employed as the heating means in the second embodiment, the user cannot visually perceive the initiation of energization of the heating means immediately after the initiation and therefore, activation of the buzzer 23 is more advantageous.

Although the control means comprises a one-chip microcomputer 19 in the foregoing embodiments, it may be comprised of a microcomputer including a plurality of LSIs and ICs. Furthermore, the control means may comprise timer means for time counting the duration of the operation signal continuously supplied from the switch thereto and energization control means for controlling the heating means so that energization of the heating means is initiated when the time counted value of the timer means reaches a predetermined value. In this case, the timer means may comprise a timer circuit and the energization control means may comprise logic circuitry or the like. Furthermore, sound producing means other than the buzzer or display elements such as a light emitting diode may be employed as the alarm means.

The foregoing disclosure and drawings are merely illustrative of the principles of the present invention and are not to be interpreted in a limiting sense. The only limitation is to be determined from the scope of the appended claims.

What I claim is:

1. A heating cooking appliance comprising:
   a) heating means for cooking;
   b) a switch generating an operation signal while being touched or depressed with a finger or the like, said heating means initiating a heating operation in response to the operation signal;
   c) control means for controlling said heating means so that energization of said heating means is initiated in the case where the operation signal generated by said switch is continuously input into said control means for a predetermined period of time; and
   d) alarm means activated while the operation signal is being generated and deactivated when energization of said heating means is initiated.

2. A heating cooking appliance according to claim 1, wherein said alarm means comprises a buzzer.

3. A heating cooking appliance comprising:
   a) heating means for cooking;
   b) a switch generating an operation signal while being touched or depressed with a finger or the like, said heating means initiating a heating operation in response to the operation signal;
   c) control means for controlling said heating means so that energization of said heating means is initiated in the case where the operation signal generated by said switch is continuously input into said control means for a predetermined period of time; and
   d) a buzzer activated for a predetermined period when energization of said heating means is initiated.

* * * * *